Jan. 14, 1958 H. J. WOLL 2,820,153

ELECTRONIC COUNTER SYSTEMS

Filed Oct. 25, 1954 2 Sheets-Sheet 1

INVENTOR.
HARRY J. WOLL
BY [signature]
ATTORNEY

Jan. 14, 1958 H. J. WOLL 2,820,153

ELECTRONIC COUNTER SYSTEMS

Filed Oct. 25, 1954 2 Sheets-Sheet 2

INVENTOR.
HARRY J. WOLL
BY H. L. Newton
ATTORNEY 2,820,153

ELECTRONIC COUNTER SYSTEMS

Harry J. Woll, Haddon Heights, N. J., assignor to Radio Corporation of America, a corporation of Delaware Application October 25, 1954, Serial No. 464,506

13 Claims. (Cl. 307—88.5)

The present invention relates generally to electronic counter systems and in particular relates to systems of that type in which semiconductor devices are utilized.

A conventional counter system which has been used in the past consists of a plurality of bistable circuits connected in cascade relation. Each of the bistable circuits has two stable electrical states designated as the indicating and the non-indicating states. One of the bistable circuits in a counter of this type is in the indicating state while the remaining bistable circuits are in the non-indicating state. An input counting pulse applied to all the bistable circuits in parallel tends to trigger all of the bistable circuits into the non-indicating state. When the one circuit originally in the indicating state is triggered to the non-indicating state, it generates an output or transfer pulse which over-rides the input counting pulse at the succeeding bistable circuit and triggers the latter to the indicating state. Successive input counting pulses will thereby advance the indicating state from one stage to the next. The last stage may be coupled back to the first stage to form a closed ring; a counter system of this type is generally known as a ring counter.

A difficulty which has been encountered with counters of the type described is that the transfer pulse generated in response to the change of the originally indicating bistable circuit from the indicating to the non-indicating state tends to trigger the succeeding bistable circuit to the indicating state, while the input counting pulse simultaneously tends to trigger this succeeding bistable circuit into the non-indicating state. The transfer pulse must either overcome the effect of the input counting pulse by brute force, or must be delayed so that its effect takes place after that of the input counting pulse. The operation of a transistor counter system of the type described may therefore be subject to these known characteristics.

Accordingly, it is a primary object of the present invention to provide an improved counter system which may utilize semiconductor devices without being subject to undesirable operating characteristics as above referred to.

It is a further object of the present invention to provide an improved counter system which may utilize semiconductor devices and provide stable and reliable operation.

It is a still further object of the present invention to provide an improved counter system in which the coaction of the transfer pulse and the input counting pulse, as hereinbefore described, is avoided.

In the improved counter system of the present invention, a series of advance pulses of alternately opposite polarity, generated in response to input counting pulses are applied in parallel to each of a plurality of cascaded bistable circuits or stages. The bistable circuits are connected so that successive stages require advance pulses of opposite polarity to trigger them into the non-indicating state. When an input counting pulse triggers an indicating stage to the non-indicating state, a transfer pulse is generated which triggers the immediately succeeding stage into the indicating state. The input counting pulse, which is also simultaneously applied in parallel to the immediately succeeding stage, is of a polarity opposite to that required to trigger the succeeding stage into the non-indicating state. The transfer pulse therefore need not overcome the effect of the advance pulse in triggering the succeeding stage into the indicating condition.

The next advance pulse is of opposite polarity to the first and is therefore of correct polarity to trigger the aforementioned succeeding stage into the non-indicating state. This stage then in turn generates a transfer pulse which is applied to the next following stage.

A unilaterally conducting device, such as a diode, connected between each bistable circuit and the source of advance pulses, and poled to pass pulses which trigger the circuit into the non-indicating state, prevents advance pulses of opposite polarity from triggering the bistable circuits into the indicating state.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings in which:

Figure 1:
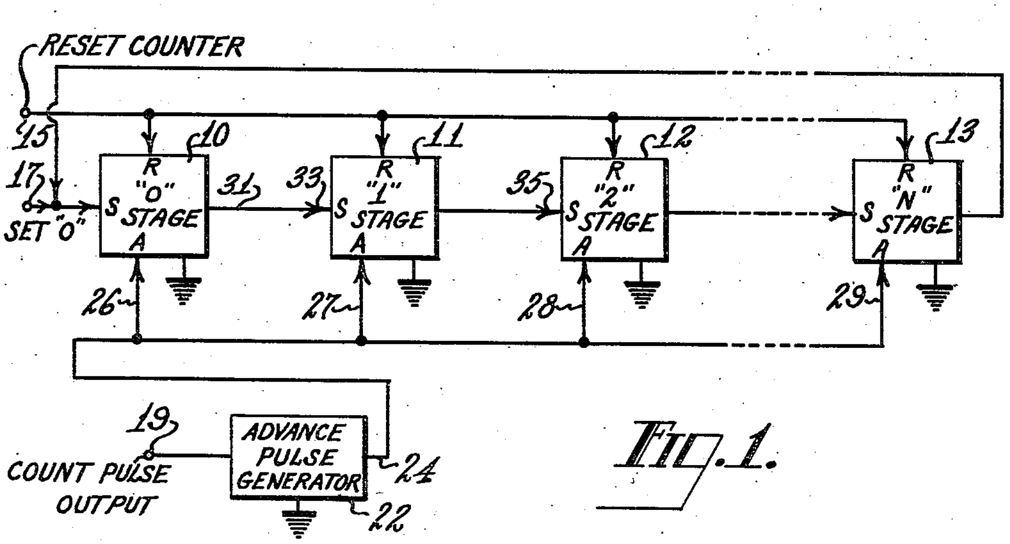
Figure 1 is a circuit diagram in block form showing a counter system in accordance with the present invention.

Referring now to the drawings wherein like reference characters are used to designate like elements throughout the various figures, and referring particularly to Figure 1, a counter system includes a plurality of stages illustrated as a "0" stage 10, a "1" stage 11, a "2" stage 12, and an "*n*" stage 13, connected in cascade relation. Each stage may consist of a bistable circuit such as a transistor circuit hereinafter described, having an indicating and a non-indicating state.

In operation, one of the plurality of stages will be in the indicating state while the remaining stages will be in the non-indicating state. This condition is established by applying a reset signal between a reset counter terminal 15 and ground, the terminal 15 being connected in parallel to each of the stages which are arranged to be triggered into the non-indicating state by the reset signal. A signal applied between a set "0" terminal 17 and ground will trigger the "0" stage 10 into the indicating state. The counter is thus prepared for normal counting operating, in which one of the plurality of stages is in the indicating state while the remaining stages are in the non-indicating state.

Input counting pulses from any convenient source are applied between a count pulse input terminal and ground. The count pulse input terminal is connected to an advance pulse generator 22, having an output circuit 24 coupled in parallel to advance pulse input circuits 26, 27, 28 and 29 of the cascaded bistable circuits.

The advance pulse generator 22 generates an advance pulse in response to each input counting pulse applied to the count pulse input terminal 19, alternate advance pulses are of opposite polarity. Alternate stages of the cascaded bistable circuits 10, 11, 12 and 13 are arranged to be triggered from the indicating state to the non-indicating state by advance pulses of one polarity, while the remaining stages are arranged to be so triggered by advance pulses of opposite polarity.

It will be assumed for purposes of illustration, that the "0" stage 10 has been triggered into the indicating condition as described above. In response to a pulse of appropriate polarity applied between the count pulse input terminal 19 and ground, an advance pulse is generated by the advance pulse generator 22, and is applied to the advance pulse input circuit 26 of the "0" stage 10. This stage is thereby triggered into the nonindicating state, and generates an output or transfer pulse as its output circuit 31 which is connected to the set terminal 33 of the "1" stage 11. This pulse triggers the "1" stage 11 into its indicating state, thereby increasing the count registered by one unit.

The advance pulse which triggers the "0" stage 10 into the non-indicating state, although applied to the advance pulse input circuit 27 of the "1" stage 11, does not tend to trigger the "1" stage 11 into the non-indicating state since this stage is arranged to be so triggered by a pulse of opposite polarity to that of the pulse which triggers the "0" stage into the non-indicating state. Hence, no difficulty is encountered due to coaction of the transfer and advance pulses in triggering the "1" stage 11 into the indicating state.

The next succeeding input counting pulse applied to the count pulse input terminal 19 causes an advance pulse to be generated by the advance pulse generator 22, and applied in parallel to the advance pulse input circuits 26, 27, 28 and 29. This advance pulse is of opposite polarity to the preceding one and therefore will trigger the "1" stage 11 into its non-indicating state. This causes a transfer pulse to be generated by the "1" stage 11 which is coupled to the set input circuit 35 of the "2" stage 12 thereby triggering this stage into its indicating condition. In like manner, the indicating state is advanced from one stage to the next in response to further input counting pulses. For illustrative purposes, the last stage is cascade-coupled to the first stage, thereby forming a closed ring. An open-ended counter such as a shift register may also be provided in the illustrated system by omitting the cascade connection between the "*n*" stage 13 and the "0" stage 10.

Figure 2:
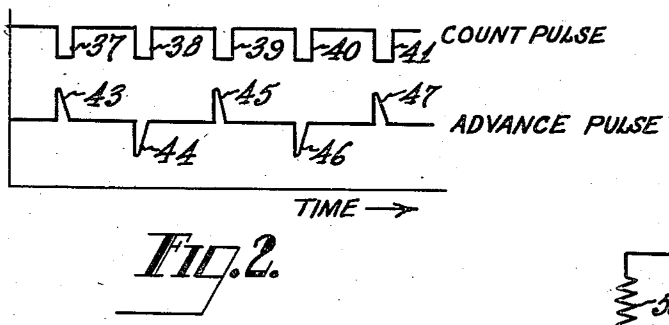
Figure 2 is a graph showing curves illustrating the time dependance of certain pulse voltages in the system of Figure 1, in accordance with the present invention.

Referring now to Figure 2, a series of input counting pulses 37, 38, 39, 40 and 41 are shown in the curve 36. These pulses, when applied to the advance pulse generator 22 as shown in Figure 1, to which reference is now jointly made with Figure 2, a series of advance pulses 43, 44, 45, 46 and 47 are generated and appear at the output circuit 24. It is thus seen that successive input counting pulses will cause advance pulses of alternately opposite polarity to be generated by the advance pulse generator 22. The method of generating these advance pulses will be obvious to one skilled in the art and may, for example, include the use of a bistable circuit for generating square waves in response to input counting pulses and differentiation of this square wave by means of a series capacitor shunt resistor differentiating network.

Figure 3:
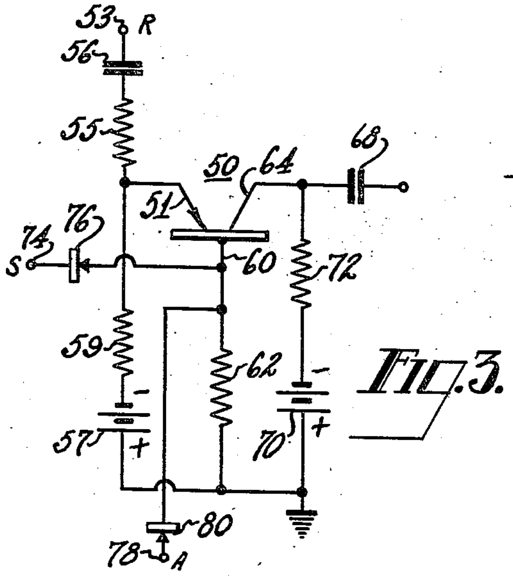
Figure 3 is a schematic circuit diagram illustrating a bistable transistor circuit which may be used in alternate stages of the system of Figure 1, in accordance with the present invention.

Reference is now made to Figure 3, wherein a bistable circuit illustrating one form of a circuit which may be utilized in alternate stages of the counter system of Figure 1, includes a transistor 50 having an emitter electrode 51 connected to a reset terminal 53 through the series combination of an isolating resistor 55 and a coupling capacitor 56. Bias current is supplied to the emitter electrode 51 from a source of potential illustrated as a battery 57 and an emitter resistor 59 connected in series relation between the emitter electrode 51 and a point of substantially fixed reference potential or ground.

The transistor 50 further includes a base electrode 60 which is connected to ground through a base resistor 62, and a collector electrode 64 which is coupled to a signal output circuit illustrated as an output terminal 66 through a coupling capacitor 68. Energizing current is supplied to the collector electrode 64 by the series combination of a source of potential illustrated as a battery 70 and a collector load resistor 72 connected between the collector electrode 64 and ground.

A set input circuit illustrated as a set terminal 74 is coupled to the base electrode 60 through a diode 76 which is poled to pass pulses having a polarity to trigger the transistor 50 into the indicating state. The set terminal 74 corresponds, for example, to the input circuit 33 of the "1" stage 11 of Figure 1. An advance pulse input circuit 78 corresponds, for example, to the advance pulse input circuit 27 of the "1" stage 11 of Figure 1 and is coupled to the base electrode 60 through a diode 80 which is poled to pass pulses having a polarity to trigger the transistor 50 into the non-indicating state.

In the illustrated example, the transistor 50 should preferably be of the current multiplication type and may, for example, be a point contact transistor, having a current gain between the emitter electrode 51 and the collector electrode 64 greater than unity. A current multiplication transistor in combination with the circuit illustrated is known to provide bistable operation, there being two stable states, designated as the indicating state and the non-indicating state. Generally a condition of relatively high collector current is utilized as the indicating state while a condition of relatively low collector current is utilized as the non-indicating state.

The transistor 50 may be of the N type as illustrated in Figure 3 or may be of the P type provided that the polarities of the batteries and of the applied pulses are reversed and provided further that the diodes 76 and 80 are poled in the reverse direction. For the N type transistor 50 illustrated, a negative pulse applied to the set terminal 74 and coupled to the base electrode 60 will trigger the circuit into its indicating state or condition of relatively high collector current. On the other hand, an advance pulse of positive polarity applied to the advance pulse terminal 78 and coupled to the base electrode 60 will trigger the circuit into the non-indicating state thereby causing a negative step in the voltage at the collector electrode 64. This negative step is differentiated by the capacitor 68 and the input impedance of the following stage, thereby applying a negative pulse to the set input circuit of the succeeding stage in order to trigger it into the indicating state.

Figure 4:
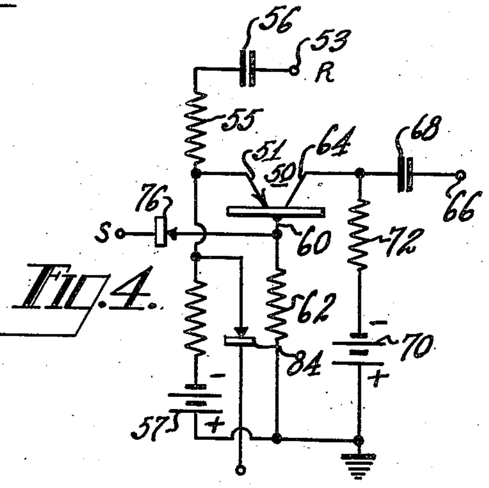
Figure 4 is a schematic circuit diagram illustrating a bistable transistor circuit which may be used in intermediate alternate stages of the system of Figure 1, in accordance with the present invention.

Referring now to Figure 4, a bistable circuit is shown which is generally similar to the bistable circuit of Figure 3, except for the point of application of advance pulses. An advance pulse input circuit illustrated as an advance pulse terminal 52 is coupled to the emitter electrode 51 of the transistor 50 through a diode 84 which is poled to pass advance pulses which trigger the transistor 50 into its non-indicating state. If the transistor 50 is of the N type as illustrated in Figure 4, these pulses should be positive. Where the circuit of Figure 3 is illustrative of a bistable circuit which may be utilized in alternate stages of ring counter systems shown in Figure 1, the circuit of Figure 4 is illustrative of a bistable circuit which may be utilized in intermediate alternate stages, since it is adapted to be triggered into its non-indicating state by advance pulses of opposite polarity to advance pulses which actuate the bistable circuit of Figure 3.

While the circuit of Figure 4 shows a current multiplication transistor utilized in a bistable circuit, it is noted that any bistable circuit may be utilized provided that the bistable circuit utilized may be triggered into its non-indicating state by advance pulses of opposite polarity to that of the advance pulses required to trigger the bistable circuit of Figure 3 into its non-indicating state.

Figure 5:
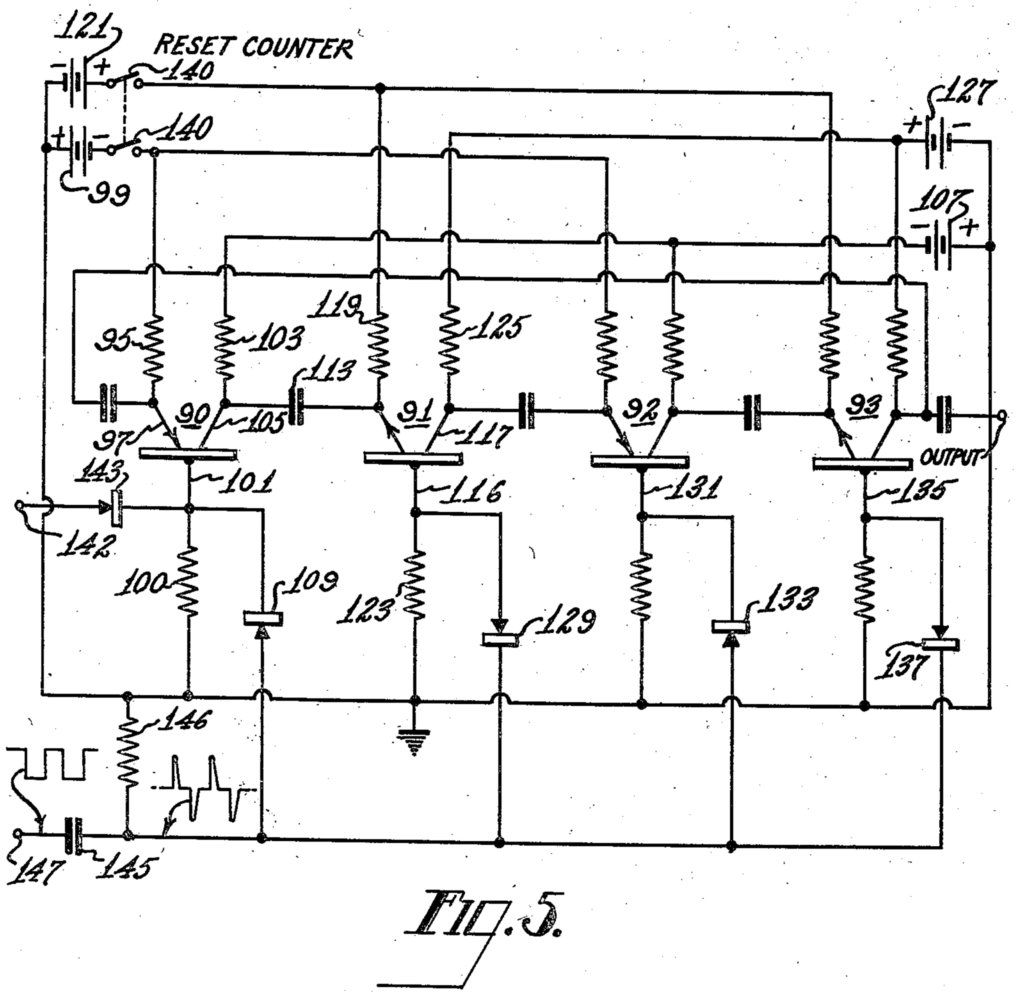
Figure 5 is a schematic circuit diagram showing a ring counter system illustrating another embodiment of the present invention.

Referring now to Figure 5, a four stage ring counter in accordance with the present invention utilizes four cascade-coupled bistable circuits including four transistors 90, 91, 92 and 93. The transistors 90 and 92 are of one conductivity type, shown for purposes of illustration to be of the N type, while the transistors 91 and 93 are of opposite conductivity type and are therefore shown as P type transistors.

The first bistable circuit, including the transistor 90, further includes an emitter resistor 95 connected between an emitter electrode 97 and the negative terminal of a source of potential illustrated as a battery 99, the other terminal of which is connected to ground. A base resistor 100 is connected between the base electrode 101 of the transistor 90 and ground. A collector resistor 103 is connected between the collector electrode 105 of the transistor 90 and the negative terminal of a source of potential illustrated as a battery 107, the other terminal of which is connected to ground.

A diode 109 is connected between the base electrode 101 and an advance pulse bus 111 and is poled to conduct positive pulses from the advance pulse bus 111 to the base electrode 101. These pulses are of appropriate polarity to trigger the bistable circuit into the non-indicating state as described with reference to the bistable circuit of Figure 3.

The following stage, including the transistor 91, further includes a base electrode 116 and a collector electrode 117. Bias current is supplied to the emitter electrode 115 of the transistor 91 by an emitter resistor 119 connected to the positive terminal of a source of potential illustrated as a battery 121, the other terminal of which is connected to ground. The base electrode 116 connected to ground through a base resistor 123. Energizing current is supplied to the collector electrode 117 through a collector resistor 125 which is connected to the positive terminal of a source of potential illustrated as a battery 127, the other terminal of which is connected to ground. The base electrode 116 is connected to the advance pulse bus 111 through a diode 129 which is poled to pass negative pulses from the advance pulse bus 111 to the base electrode 116.

The transistor 92 is connected in a bistable circuit identical to that described for the transistor 90 and includes a base electrode 131 connected to the advance pulse bus 111 through a diode 133 poled to conduct positive pulses to the base electrode 131. The transistor 93 is connected in a circuit identical to that described for the transistor 91 and includes a base electrode 135 which is coupled to the advance pulse bus 111 through a diode 137 which is poled to pass negative pulses to the base electrode 135.

The counter may be reset by removing the emitter bias from each stage, thereby returning all of the stages to the non-indicating state. This is accomplished in the counter of Figure 5 by a switch 140 which may be used to disconnect the batteries 99 and 121 from the emitter circuits of the stages of the counter. A set input terminal 142 is coupled to the base electrode 101 through a diode 143 poled to pass pulses to trigger the transistor 90 into its indicating state.

A differentiating network consisting of a series capacitor 145 and a shunt resistor 146 is connected between an input terminal 147 and the advance pulse bus 111. Pulses of alternately opposite polarity will therefore appear on the advance pulse bus 111 in response to a square wave applied to the input terminal 147. This square wave may be derived, for example, from a bistable circuit in response to input counting pulses applied to the bistable circuit.

When the first stage of the counter which includes the transistor 90 is triggered into its non-indicating state in response to a positive pulse from the advance pulse bus 111, a negative step appears in the voltage at the collector electrode 105. This voltage step is differentiated by the capacitor 113 in combination with the input impedance of the following stage. A negative transfer pulse is therefore applied to the emitter electrode 115 of the transistor 91, thereby triggering the transistor 91 into its indicating state. The diode 137 prevents the positive advance pulse from triggering the transistor 93 into the indicating state. The positive pulse is coupled to the base electrode 131 of the transistor 92, but has no effect at this point since the transistor 92 is already in the non-indicating state.

The succeeding advance pulse is negative and is therefore applied to the base electrodes 116 and 135 through the diodes 129 and 137 respectively. The transistor 93, being in the non-indicating state, is not affected by this advance pulse. The transistor 91, however, is triggered from the indicating state to the non-indicating state thus causing a positive step to appear at the voltage of the collector elecrode 117. This positive step is differentiated by a coupling capacitor 149 connected between the collector electrode 117 and the emitter electrode of the transistor 92. The resulting positive transfer pulse applied to the emitter electrode triggers the transistor 92 into an indicating state.

The use of transistors of opposite conductivity types in the ring counter system of Figure 5 allows the advance pulse bus 111 to be coupled to the base electrodes of each of the stages so that the bistable circuits all present a uniform load to the advance pulse bus 111.

Successive advance pulses will thereby advance the indicating state around the closed loop. Thus, the ring counter of Figure 5 is seen to operate in accordance with the present invention, wherein a transfer pulse which triggers the succeeding stage to the indicating state is the sole pulse acting thereon, thereby avoiding marginal operation resulting from the coaction of transfer pulses and advance pulses.

An improved counter system in accordance with the present invention provides reliable operation and an effective method of applying advance pulses to the counter stages, whereby the signal transfer from one stage to the next is not interfered with by advance pulses being applied to the following stage. Furthermore, as shown herein the circuit is particularly adapted for the effective use of semiconductor devices and therefore affording improved and efficient operation.

What is claimed is:

1. A counter system comprising in combination, a plurality of cascade-coupled bistable pulse transfer circuits, an advance pulse circuit, means coupled between said bistable circuits and said advance pulse circuit for triggering alternate bistable circuits into a non-indicating state in response to pulses of one polarity, and means coupled between said bistable circuits and said advance pulse supply circuit for triggering the remaining bistable circuits into a non-indicating state in response to pulses of opposite polarity.

2. A counter system as defined in claim 1, wherein said bistable circuits are coupled to form a closed ring.

3. A counter system as defined in claim 2, wherein said system further includes circuit means for triggering a predetermined one of said plurality of bistable circuits into said indicating state and the remaining bistable circuits into said non-indicating state, whereby the application of an advance pulse to said predetermined one of said plurality of bistable circuits causes said indicating state to advance to the succeeding stage.

4. A counter system comprising in combination, a plurality of cascade-coupled bistable circuits, an advance pulse input circuit, first means coupled between said bistable circuits and said advance pulse input circuit for triggering alternate bistable circuits into a non-indicating state in response to pulses of one polarity, second means coupled between said bistable circuits and said advance pulse circuit for triggering the remaining bistable circuits into a non-indicating state in response to pulses of opposite polarity, and a signal output circuit coupled with one of said bistable circuits.

5. A counter system as defined in claim 4, wherein each of said bistable circuits comprises a transistor having base, emitter and collector electrodes, said first means being coupled with the base electrodes of said alternate stages, said second means being coupled with the emitter electrodes of said remaining bistable circuits and wherein said signal output circuit is coupled with the collector electrode of one of said bistable circuits.

6. A counter system comprising in combination, a plurality of cascade-coupled bistable signal transfer circuits, alternate ones of said circuits being adapted to be triggered into a non-indicating state in response to pulses of one polarity and the remaining circuits being adapted to be triggered into a non-indicating state in response to pulses of the opposite polarity, a count pulse input circuit, an advance pulse supply circuit connected with each of said bistable circuits in parallel, and means coupled between said input circuit and said advance pulse supply circuit for providing said pulses of alternately opposite polarity in response to pulses from said input circuit, whereby the indicating state is advanced through said cascade connected circuits in response to count pulses applied to said input circuit.

7. A counter system comprising in combination, a plurality of cascade-coupled bistable signal transfer circuits, alternate circuits being adapted to be triggered into a non-indicating state in response to advance pulses having a predetermined polarity and to be relatively unaffected by pulses of an opposite polarity and the remaining circuits being adapted to be triggered into a non-indicating state in response to pulses of opposite polarity and to be relatively unaffected by said pulses of predetermined polarity, a count pulse input circuit, an advance pulse supply circuit connected with each of said bistable circuits in parallel, and means coupled between said input circuit and said advance pulse supply circuit for providing pulses of alternately opposite polarity in response to pulses from said input circuit for actuating said circuits successively.

8. A counter system comprising in combination, a plurality of cascade-coupled pulse transfer stages each having an indicating and a non-indicating state, a count pulse input circuit for providing input pulses, an advance pulse generator coupled with said input circuit for generating advance pulses of alternately opposite polarity in response to input pulses applied thereto, means connected between said pulse generator and alternate stages in said system for triggering each of said alternate stages into said non-indicating state in response to advance pulses having one polarity, and means connected between said pulse generator and the remaining stages of said system for triggering each of said remaining stages into said non-indicating state in response to advance pulses having a polarity opposite to said one polarity.

9. A counter system as defined in claim 8, wherein said bistable circuits are coupled to form a closed signal ring.

10. A counter system comprising in combination, a plurality of cascade-coupled bistable pulse transfer circuits, an advance pulse supply circuit connected in parallel with said bistable circuits, alternate ones of said bistable circuits being adapted to be triggered into a non-indicating state in response to advance pulses of one polarity, the remaining ones of said bistable circuits being adapted to be triggered into a non-indicating state in response to pulses of opposite polarity, a count pulse input circuit, and means coupled with said input circuit and responsive to pulses therefrom connected for applying pulses of alternately opposite polarity to said advance pulse supply circuit.

11. A counter system comprising in combination, a plurality of cascade-coupled stages, each of said stages including a bistable circuit comprising a transistor having base, emitter and collector electrodes, an advance pulse circuit, means for applying pulses of alternately opposite polarity to said advance pulse circuit, and means connecting said advance pulse circuit with each of the base electrodes of alternate ones of said plurality of stages and each of the emitter electrodes of the remaining ones of said plurality of stages, said last named means including a unilateral conducting device poled for applying advance pulses to each of said stages to trigger said stages into a non-indicating state.

12. A counter system comprising in combination, a plurality of cascade-coupled signal transfer stages, each of said stages including a bistable circuit comprising a transistor having base, emitter and collector electrodes, said transistors of alternate stages being of one conductivity type, said transistors of the remaining stages being of opposite conductivity type, an advance pulse circuit, means for applying pulses of alternately opposite polarity to said advance pulse circuit, and means connecting said advance pulse circuit with each of said base electrodes, said last named means including a unilateral conducting device poled for applying advance pulses to each of said stages to trigger said stages into a non-indicating state.

13. A counter system as defined in claim 12, wherein said bistable circuits are connected to form a closed ring.

References Cited in the file of this patent

UNITED STATES PATENTS

| | | |
|---|---|---|
| 2,379,093 | Massonneau | June 26, 1945 |
| 2,591,961 | Moore et al. | Apr. 8, 1952 |
| 2,594,336 | Mohr | Apr. 29, 1952 |
| 2,644,897 | Lo | July 7, 1953 |
| 2,758,250 | Ridler et al. | Aug. 7, 1956 |